(12) United States Patent
Ekberg

(10) Patent No.: US 7,709,165 B2
(45) Date of Patent: *May 4, 2010

(54) IMAGE ENHANCEMENT FOR MULTIPLE EXPOSURE BEAMS

(75) Inventor: Peter Ekberg, Lidingö (SE)

(73) Assignee: Micronic Laser Systems AB, Taby (SE)

( * ) Notice: Subject to any disclaimer, the term of this patent is extended or adjusted under 35 U.S.C. 154(b) by 212 days.

This patent is subject to a terminal disclaimer.

(21) Appl. No.: 11/877,470

(22) Filed: Oct. 23, 2007

(65) Prior Publication Data

US 2009/0170016 A1 Jul. 2, 2009

Related U.S. Application Data

(63) Continuation of application No. 10/778,668, filed on Feb. 13, 2004, now Pat. No. 7,285,365.

(51) Int. Cl.
*G03F 9/00* (2006.01)
*G03C 5/00* (2006.01)

(52) U.S. Cl. .................. 430/30; 430/296; 430/311; 430/942; 430/945

(58) Field of Classification Search .................. 430/30, 430/296, 311, 942, 945
See application file for complete search history.

(56) References Cited

U.S. PATENT DOCUMENTS

| | | | |
|---|---|---|---|
| 4,636,077 A | | 1/1987 | Nomura et al. |
| 4,734,345 A | | 3/1988 | Nomura et al. |
| 5,635,976 A | * | 6/1997 | Thuren et al. ............... 347/253 |
| 5,980,088 A | | 11/1999 | Iwasaki et al. |
| 7,285,365 B2 | * | 10/2007 | Ekberg ........................ 430/30 |
| 2001/0055107 A1 | | 12/2001 | Tsuji |
| 2002/0196534 A1 | | 12/2002 | Lizotte et al. |

FOREIGN PATENT DOCUMENTS

| | | |
|---|---|---|
| EP | 1387389 | 2/2004 |
| JP | 60 067932 | 4/1985 |

OTHER PUBLICATIONS

Pearce-Percy et al., "Dynamic Corrections in MEBES 4500." J. Vac. Sci. Technol. B 12(6), Nov./Dec. 1994, 3393-3398.
International Search Report of International Application No. PCT/SE2005/000077 mailed on May 17, 2005.
International Preliminary Report on Patentability for International Application No. PCT/SE2005/000077 completed May 16, 2006.
"Reply to third written opinion of Mar. 17, 2006" for International Application No. PCT/SE2005/000077 dated Apr. 6, 2006.
Written Opinion of the International Preliminary Examining Authority for International Application No. PCT/SE2005/000077 mailed on Mar. 17, 2006.
Written Opinion of the International Preliminary Examining Authority for International Application No. PCT/SE2005/000077 mailed Feb. 15, 2006.

* cited by examiner

*Primary Examiner*—Christopher G Young
(74) *Attorney, Agent, or Firm*—Ernest J. Beffel, Jr.; Haynes Beffel & Wolfeld LLP

(57) ABSTRACT

An aspect of the present invention includes a method for patterning a workpiece covered at least partly with a layer sensitive to electromagnetic radiation by using a plurality of exposure beams having a predetermined separation in at least a first direction for exposing a pattern onto said workpiece, where said predetermined separation is fixed to an initial system pitch in said first direction, comprising the actions of: scaling a pattern pitch in said first direction to be an integer multiple of said system pitch, adjusting the initial system pitch in said first direction to be an adjusted system pitch to maintain a scale of said pattern, adjusting said predetermined separation of exposure beams to said adjusted system pitch.

4 Claims, 4 Drawing Sheets

IMAGE ENHANCEMENT FOR MULTIPLE EXPOSURE BEAMS

RELATED APPLICATION

This application is a continuation of U.S. application Ser. No. 10/778,668 filed 13 Feb. 2004, filed by the same inventor under the same title as this application.

TECHNICAL FIELD

The present invention relates to a method for patterning a workpiece. In particular it relates to a method to enhance an image to be patterned on said workpiece by using a plurality of exposure beams.

BACKGROUND OF THE INVENTION

When creating cyclic patterns in masks or reticles for the production of instance displays, such as TFT-LCDs or plasma-displays, a key quality requirement is the absence of defects, such as shade differences, light and dark fields, stripes or lines in said pattern.

Deviations, e.g. CD (critical dimension) or positioning errors, causing said defects are usually very small, from a few hundred nanometers down to a single nanometer. Deviations of that size spread over a relatively large area on a display photo mask, which may be 1500×1200 mm, may be very difficult or impossible to detect by measuring. Unfortunately, a human eye is very sensitive to systematic changes and therefore can detect such small deviations as stripes in the image. The human eye is extremely sensitive to periodical intensity variations in the image. The viewing distance will influence the appearance of said periodical intensity variations. Generally speaking, periodical intensity variations will be detectable by the human eye if the difference in contrast is around and above 0.5% in a spatial frequency range of 1-20 mm. For normal viewing distances, periodical intensity variations below about 1 mm will not show up.

There are some methods known in the art to reduce or eliminate the appearance of defects in a photo mask. The methods known in the art are especially suitable to reduce or eliminate the appearance of periodical defects, which is the most common defect.

Periodical defects are caused by the beating frequencies between a pattern pitch and a system pitch in a certain direction. The pattern pitch is defined as the distance between equal features in the pattern. The pattern pitch may be different in an X and a Y direction of said pattern. One system pitch in a raster scanning system is a Y-pitch, defining a distance between two adjacent centers of gravity of exposure spot sizes along a sweep direction of said exposure beam. Numerous exposure spots, in the range of several hundreds, form a scan line along the sweep direction. Preferably the exposure spot is continuously on within a scan line, but it may be switched off at any given time determined by a frequency of a clock generator connectable to a modulator which is modulating said exposure beam according to desired pattern data. Another system pitch is an X-pitch, defining a distance between two adjacent parallel scan lines of said exposure beam. Numerous scan lines in X-direction form a strip. Strips stitched together will form a desired pattern on the workpiece.

One compensation method for eliminating or reducing periodical defects in the pattern on the workpiece is called scaling, which means that the distance from one feature to another feature in the pattern, i.e., the pattern pitch in X- and Y-direction, should be an integer multiple of the system pitches. If there is a mismatch in one or two directions, the pattern is resealed in one or two directions to match said system pitches. Pattern size is maintained by adjusting a scale reference in the machine, for instance by changing the wavelength of an interferometer or resealing an initial interferometer scale by a desired factor, which interferometer functions as a position measuring device in said direction, see U.S. Pat. No. 5,635,976.

Unfortunately, when correcting the pattern as described herein above, masks or reticles patterned by using multiple exposure beams for increasing the writing speed may present certain side effects such as increased CD (critical dimension)-error. i.e., lines or features printed on a workpiece having less uniform line widths.

What is needed is a method and apparatus, capable of using the above-mentioned compensation methods for periodical defects without increasing CD-error when creating a pattern on the workpiece by using multiple exposure beams.

SUMMARY OF THE INVENTION

Accordingly, it is an objective of the present invention to provide a method of patterning a workpiece, which overcomes or at least reduces the above-mentioned problem of increased CD-error when compensating for periodical defects in a multi-beam pattern generator.

This objective, among others, is attained according to a first aspect of the invention by a method for patterning a workpiece covered at least partly with a layer sensitive to electromagnetic radiation by using a plurality of exposure beams having a predetermined separation in at least a first direction for exposing a pattern onto said workpiece, where said predetermined separation is fixed to an initial system pitch in said first direction, comprising the actions of: scaling a pattern pitch in said first direction to be an integer multiple of said system pitch, adjusting the initial system pitch in said first direction to be an adjusted system pitch, adjusting said predetermined separation of exposure beams to (be an integer multiple of) said adjusted system pitch.

The invention also relates to a method for patterning a workpiece covered at least partly with a layer sensitive to electromagnetic radiation by using a plurality of exposure beams having a predetermined separation in at least a first direction for exposing a pattern onto said workpiece, where said predetermined separation is fixed to an initial system pitch in said first direction, comprising the actions of: optimizing the separation between said exposure beams to reduce CD-errors in said pattern on said workpiece. Further characteristics of the invention, and advantages thereof, will be evident from the detailed description of preferred embodiments of the present invention given hereinafter and the accompanying FIGS. 1-4, which are given by way of illustration only, and thus are not limitative of the present invention.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Further, the preferred embodiments are described with reference to a laser scanning pattern generator. It will be obvious to one with ordinary skill in the art that any exposure means may be equally applicable, such as light from IR to EUV, x-ray, or particle beams such as electron, ion or atom beams.

The invention is further described with reference to the production of a mask or reticle for the production of a cyclic pattern on for instance a display. It will be obvious to one with ordinary skill in the art that the inventive method and apparatus is equally applicable in the direct writing of such cyclic patterns in displays or other semiconductor components.

Figure 4:
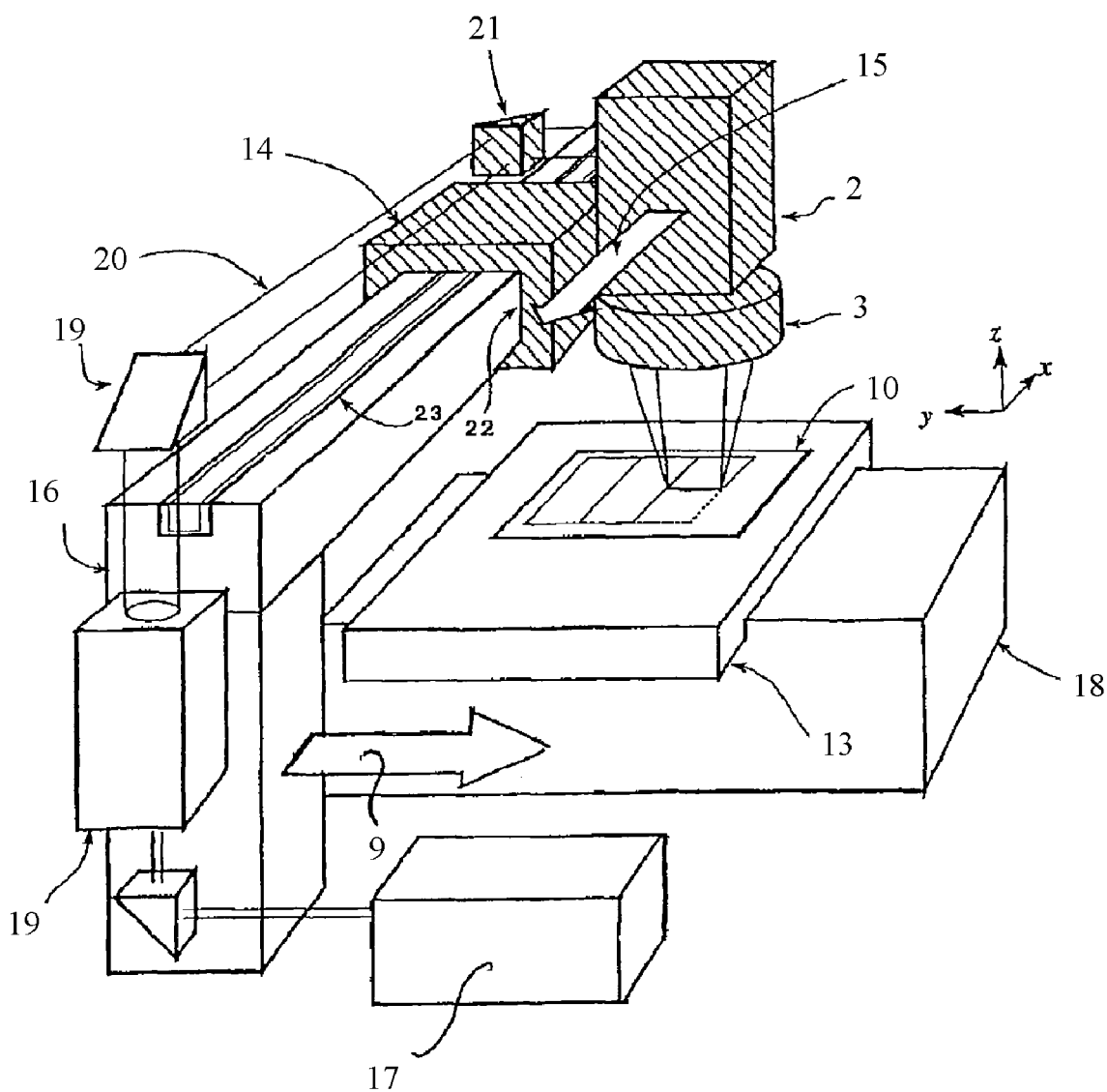
FIG. 4 depicts an embodiment of a laser pattern generator according to prior art.

FIG. 4 shows an embodiment of a laser pattern generator according to prior art. In this embodiment, a support structure 13 is carrying the workpiece 10. A writing head comprising an optical system 2 for generating object pixels on said workpiece 10 and a final lens 3 is placed on a carriage 14 that slides along a guiding rail 16 essentially along a direction X 15. The parts moving with the carriage 14 are shown hatched in FIG. 1. The guiding rail 16 moves essentially along a direction Y 9. In one embodiment, said guiding rail is moved in a stepwise fashion and said carriage 14 is moving in a continuous fashion, where a stepwise movement corresponds to a slow direction and a continuous motion corresponds to a fast movement. In another embodiment, said guiding rail 16 is moved in a continuous fashion and said carriage 14 is moving in a stepwise fashion. In still another embodiment, said guiding rail 16 is moved in a continuous fashion and said carriage 14 is also moving in a continuous fashion. In the embodiments described, the workpiece 10 is kept in a fixed position while patterning the same. The support structure 13 may be arranged on a vibration damping structure 18. Said vibration damping structure is preferably made of a high density material and may in turn be supported by an air cushion for further damping vibrations.

In FIG. 4, a far end leg of the guiding rail is omitted for visibility. The optical system 2 generates a scan line, i.e. typically several hundred pixels written in the Y-direction for each X-position along the guiding rail. Numerous scan lines will form a strip. A complete pattern comprises numerous strips, partly overlapping each other or not overlapping each other, depending on the writing strategy chosen. In one embodiment, said optical system comprises a modulator 138, a collimator lens assembly 144 and a deflector 139, see FIG. 1. The modulator 138 is used to either change the period of illumination time and/or intensity of the electromagnetic radiation from the source 17. Said modulator 138 may, for instance, be a conventional acousto-optical modulator, or any other modulator with essentially the same functionality. The deflector is used to deflect the beam of radiation for creating said scan lines. The deflector may be an acousto-optical deflector. A clock generator is connectable to the modulator and may use a 50 MHz frequency. A length of the scan line, i.e., a width of a strip, may be 200 µm. Said scan line may comprise about 800 pixels.

In another embodiment, said optical head 2 only comprises said deflector 139. In said embodiment, the modulator 138 is arranged at a fixed position from the laser source 17.

The radiation may be generated by a laser source 17, either fixedly mounted on the guiding rail or separated from said guiding rail. The radiation is expanded, collimated, homogenized and launched by an optical system 19 in a direction parallel to the guiding rail 16, so that it hits pick-up optics 21 on the carriage 14, with virtually no change in lateral position, angle, or cross section during movement along the rail.

The laser source may be a continuous or pulsed laser source. The wavelength of the laser may for instance be 413 nm.

Alignment of the guiding rail 16 with the workpiece could be performed by using interferometers in a conventional manner, see for instance U.S. Pat. No. 5,635,976 assigned to the same applicant as the present invention. In short, a control unit, not shown in the present figures, is initiating the operation of reading pattern data from a storage device and is sending instructions or command signals to servo units for controlling the movement of the guiding rail 16. The clock generator is generating a clock signal, which synchronizes operation of data delivery device, the modulator 138 and the deflector 139. The control unit provides for accurate positioning of the guiding rail with respect to the workpiece 10. The modulator 138 and the deflector may be driven by the same clock signal, which provides for high degree of accuracy. Position monitoring devices, such as an interferometer, a detector and a mirror attached to the moving device (here the guiding rail 16) monitor the position of the guiding rail 16 relative to the workpiece 10 and the final lens 3. Together with electric motors, which are moving the guiding rail 16, said position monitoring devices form a servo-mechanism, which produces a precisely controlled movement of the guiding rail 16. The clock generator (with a certain frequency), together with the interferometers (with a certain wavelength), defines the initial system grid. The scale in X-direction or Y-direction may be changed up or down by changing the frequency of one of the interferometers, or if one interferometer is used with a beam splitter to create two branches of said laser beams for positioning control in two directions, only changing the wavelength in one branch or resealing an initial scale with a certain factor, which interferometer is controlling the position in X-direction or Y-direction. This may be used for changing the initial system pitch.

The workpiece 10 may be translated in an appropriate manner, for example with piezo-electrical actuators arranged on at least one end of said support structure 13.

In the illustrated embodiment in FIG. 4, said workpiece 10 is essentially arranged in parallel with an X-Y plane. This X-Y plane could be a horizontal plane or a vertical plane. With said X-Y plane in parallel with a vertical plane, said workpiece is said to be a standing substrate. An apparatus with a standing substrate requires an essentially smaller clean room area and footprint than a machine having a horizontal substrate; however, both embodiments require smaller clean room area than conventionally used machines. With a standing substrate 10, said substrate is less sensitive to contamination, since the exposed area for particles falling down is drastically reduced compared to a substrate in parallel with a horizontal plane. In another embodiment, said substrate is inclined at any angle between 0-90° from the horizontal plane.

Another feature with a standing substrate is that so-called sag, which is more or less inevitable when having the substrate in parallel with a horizontal plane, could be more or less eliminated with a substrate essentially parallel with the vertical plane. Sag is defined as a deformation of the workpiece due to its weight. A pattern of sag depends on the type of support structures for the substrate, the number of support structures and the size and geometry of said substrate itself.

A stepping motor or linear motor may move the guiding rail. The guiding rail may slide on air bearings. There may be one air bearing under each leg of the guiding rail 16. In another embodiment, said legs of said guiding rail are coupled to each other, thereby forming a frame structure comprising an upper part on which said carriage is moving in the X-direction and a lower part comprising the air bearings along the Y-direction. Said lower part is below said vibration damping structure 18, i.e., a hollow part of said frame structure will move over the workpiece having the upper part above said workpiece and the lower part below said workpiece.

Fine positioning may exist on said guiding rail or said support structure 13. Said fine positioning may be in the form of mechanical and electronic servos. In one embodiment, there are two linear motors operating on said guiding rail for performing said movement in the Y-direction. Said linear motors may perform said fine positioning by operating them in such a manner so as to rotate the guiding rail. The rotation may be limited by the air bearing(s) attached to said guiding rail for said movement in said Y-direction.

At an end support of the support structure 13 there may be attached piezo-electric actuators displacing the support structure 13 in the Y-direction. Said actuators may be driven by analog voltages from a control system including said interferometers, detectors and mirrors and a feedback circuit sensing the position of the support structure 13 relative to that of the guiding rail 16. Together the actuators may correct for the limited resolution in the stepping motor and for non-straight travel of the guiding rail 16. Each actuator may have a movement range of 100 μm.

Instead of compensating said non straight travel of the guiding rail by actuators attached to said support structure 13, said guiding rail itself may be adjusted so that the limited resolution of said stepping or linear motor can be compensated for. In a similar manner actuators may be attached to said guiding rail and by interferometry the position of the support structure relative to the guiding rail may be constantly monitored.

In the embodiments as illustrated in FIG. 4, the carriage 14 slides on air bearings 22 along the guiding rail 16. It may be driven by a linear electric motor 23. Except for electric cables and air supply tubes, there is no physical contact between the rail 16 and the carriage 14. The only forces acting on the carriage 14 are from the contact-less motor 23 and from inertia.

In order to compensate for errors concerning the straightness of the guiding rail 16, calibration is possible. After the machine is assembled, one has to write a test plate and measure the writing errors. The errors are stored in a calibration file and fed to the control system as compensation during subsequent writing.

Said acousto-optical deflector in said optical system 2, mounted immediately above said final lens 3, may form the scan lines. Pixels may be 300×300 nm and each scan line may be 200 μm wide. The lens may be an NA=0.5 flat field corrected lens with 4 mm focal length.

Fine positioning in the X-direction may be based on the timing of the start-of-scan pulse when the final lens 3 is at its correct position. In the Y-direction, the mechanical servos described above may be supplemented by a data-delay feature, which moves the data along the acousto-optical scan as described in DE 40 22 732 A1. This is equivalent to an inertia free feed forward control system raising the bandwidth of the position control to above 100 Hz.

Allowable angle deviations from stroke to stroke of said carriage are less than 10 micro radians, and there must not be any focus shift along said stroke. This may be solved in a number of ways. First, the carriage 14 runs on air bearings preloaded to high stiffness, so that a position of the carriage 14 relative to the guiding rail 16 is well defined and independent of external air pressure and temperature. A non-perfect guiding rail may give a writing error along the scan line. However, this error can be measured during calibration, stored as a correction curve and fed to the position feedback system for compensation during writing. Focus may be kept constant by manipulating the laser beam by collimating and beam shaping optics 19.

Figure 1:
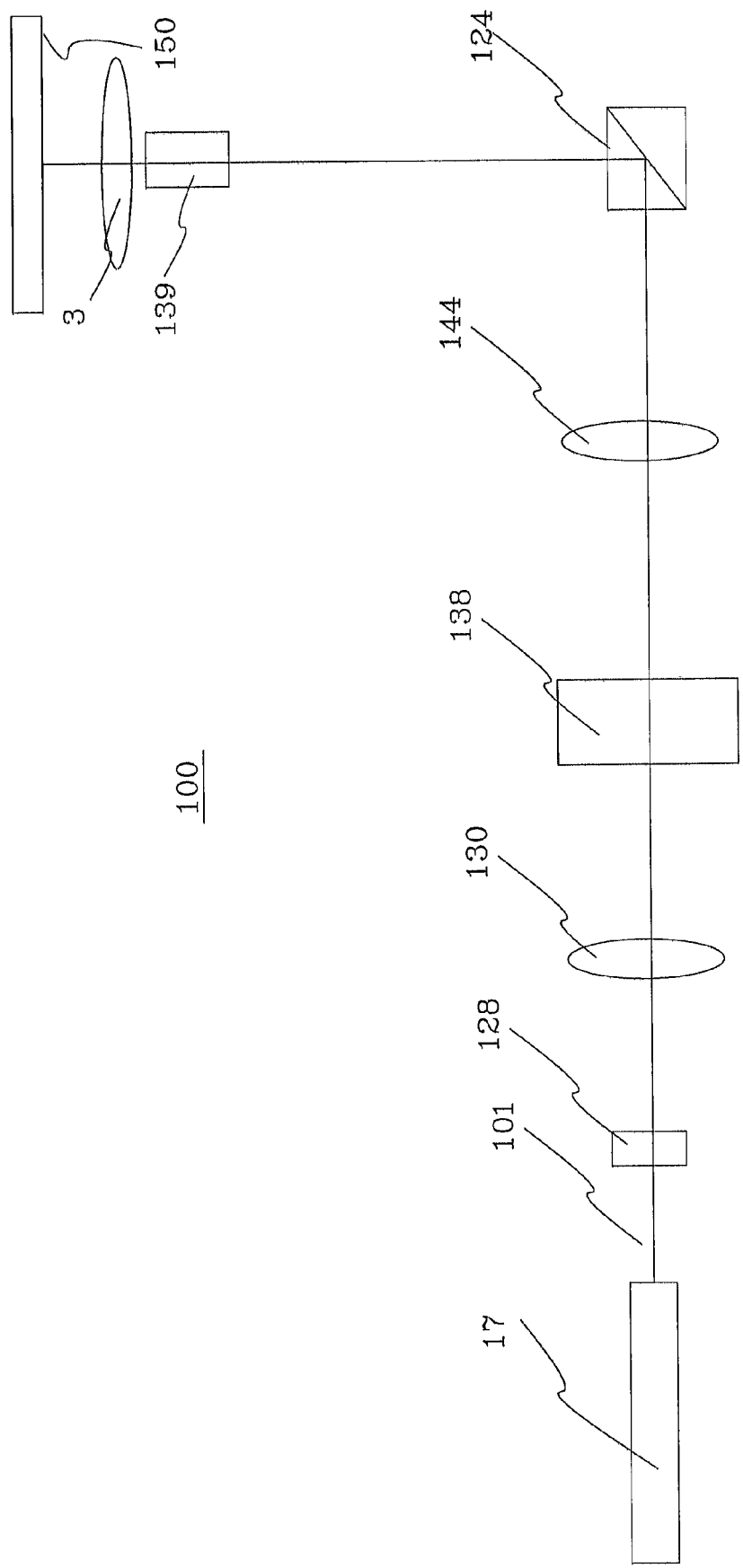
FIG. 1 depicts a schematic overview of a multi-beam optical system.

Referring now to FIG. 1, a multi-beam optical system for patterning a workpiece 100 is one example of a system that can benefit from the present invention. The multi-beam optical system comprises a laser source 17, a laser beam 101, a diffractive optical element (DOE) 128, a modulator lens assembly 130, a modulator 138, a collimator lens assembly 144, a prism 124, an acousto-optical deflector 139, a final lens 3 and a workpiece 150.

The laser source 17 may have an output wavelength at 413 nm, however other wavelengths may be used. The laser source outputs the laser radiation continuously or in a pulsed fashion.

The diffraction optical element DOE 128 separates the single laser beam into a plurality of laser beams—for instance 3, 5 or 9 beams. However, any number of laser beams can be created by inserting one or a plurality of DOEs 128.

The modulator lens assembly 130 focuses each individual laser beam into the modulator 138.

The modulator 138 modulates the incoming focused plurality of laser beams. The modulator 138 may be an acousto-optical modulator.

The prism 124 is inserted in this setup only for compressing the extension of the optical path of the laser beam.

The collimator lens assembly 144 collimates each individual divergent laser beam coming from the modulator. The collimator lens assembly is one feature in this setup, which is providing for the correct separation of the laser beams on the workpiece 150, 10.

The acousto-optical deflector deflects the laser beams onto the workpiece 10 to form said scan lines. The final lens is focusing the plurality of laser beams onto the workpiece 150, 10.

The final lens 3 and the modulator 138 are arranged at a fixed distance between each other. The collimator lens assembly 144, comprising at least two lenses, may be arranged on motorized rails or may have its internal position changed or its absolute position changed by other suitable means, such as piezo-electrical movement. Changing the distance of the collimator lens assembly from the workpiece 150 and changing a focal length of said collimator lens assembly will change the separation of the laser beams on the workpiece 10.

Another way of changing the separation of the individual laser beams on the workpiece 10 is to adjust the modulator lens assembly so that the separation between the individual laser beams will be changed in the modulator.

Still another way of changing the separation of the individual laser beams on the workpiece is to mechanically stretch the DOE 128, thereby changing a pitch of the diffractive lattice, which will result in the desired change in beam separation on the workpiece.

Figure 2:
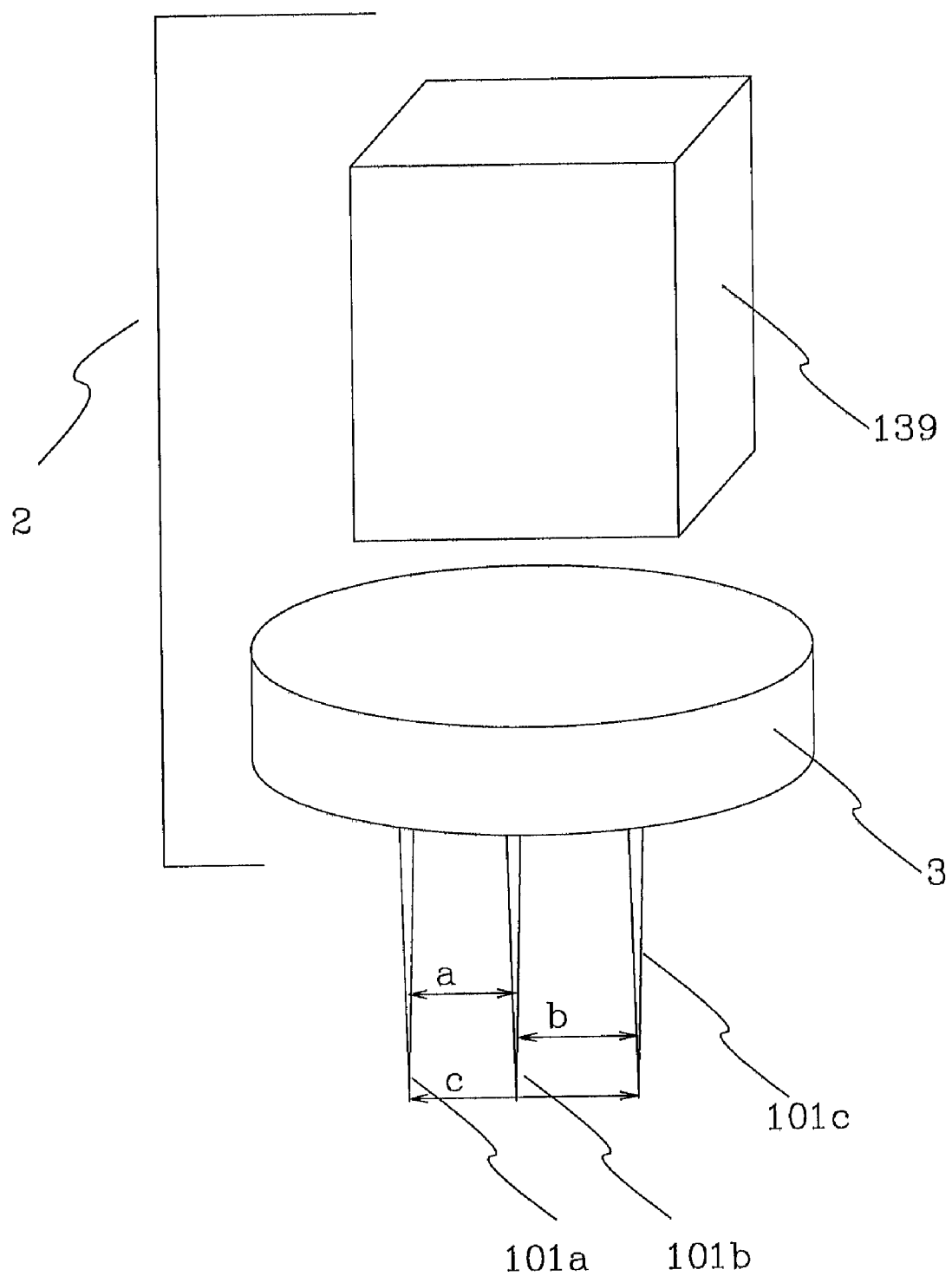
FIG. 2 depicts a deflector and a final lens together with three exposure beams.

FIG. 2 depicts an enlarged picture of the optical system 2 comprising the AOD 139 and the final lens 3, together with the initial separation between the individual laser beams 101a, 101b, and 101c. Here three laser beams are used and the separation between two adjacent laser beams, denoted in FIG. 2 with a or b, is 9.75 μm. The separation between two non adjacent laser beams, i.e., a left most laser beam 101a and a right most beam 101c, denoted in FIG. 2 with b, is 19.5 μm. The separation of the beams is perpendicular to a direction of sweeping the beams by means of said AOD 139, i.e., if said separation is extending in an X-direction, the sweep of said laser beams is extending in a Y-direction, which means the scan lines are extending in Y-direction and strips in X-direction. In a multi-beam writing strategy the initial separation between individual laser beams or exposure beams is exact or close to exact to an integer multiple of a system pitch in X-direction.

If the separation in X-direction between individual laser beams is not an integer multiple of said system pitch size in X-direction, edge roughness and pattern dependent CD (critical dimension) variations will appear in the pattern.

Scaling is one method for compensation of defects in the pattern on the workpiece 10, 150. In this method the system pitch in, for instance, the X-direction is changed in size when writing the pattern. Since the nominal separation between individual laser beams is tuned to an integer multiple of the initial system pitch in X-direction, the result will be edge roughness and pattern dependent CD variations in said pattern.

Figure 3:
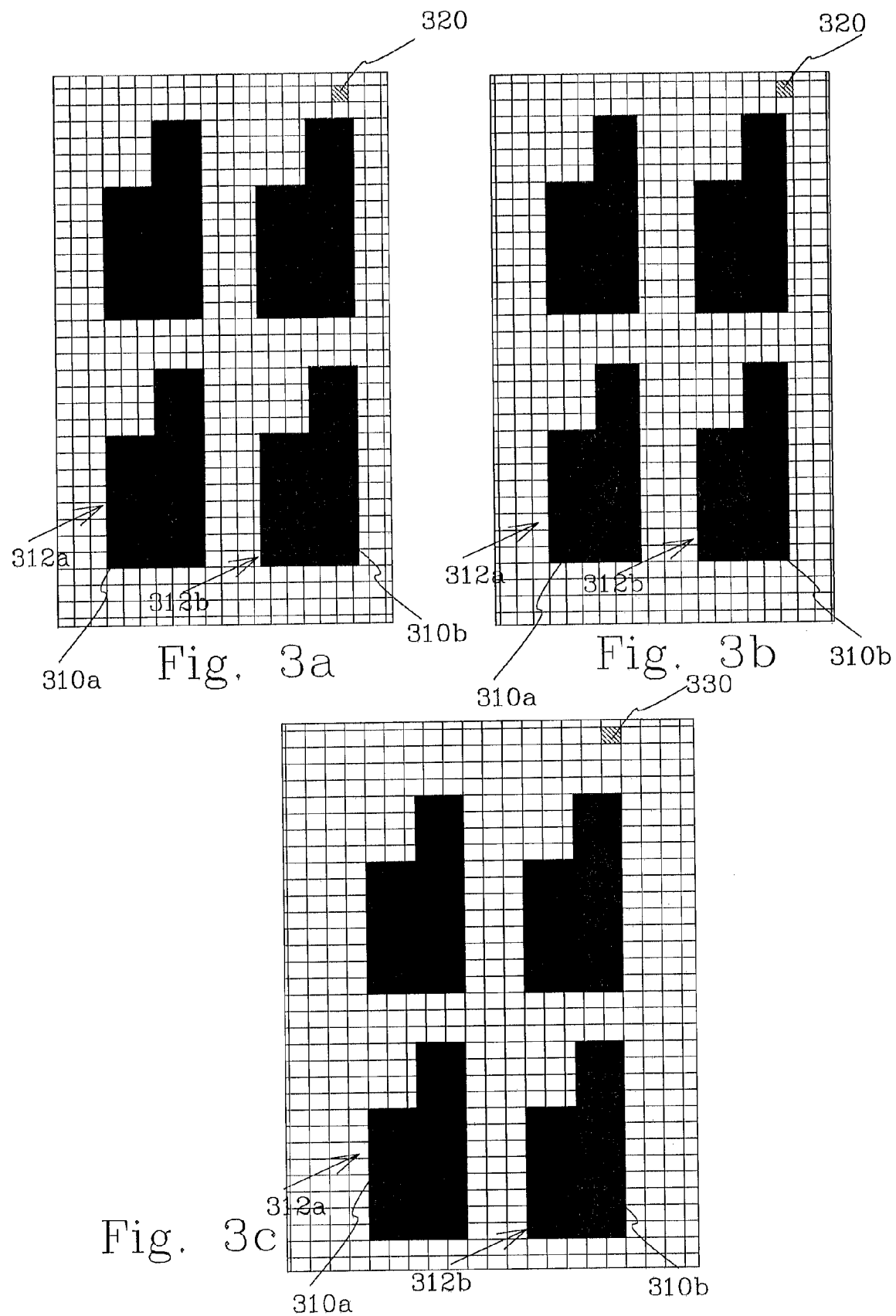
FIGS. 3a-3c illustrate how pattern pitch and system pitch is adjusted in order to eliminate intensity variations in the pattern on the workpiece.

FIG. 3a depicts a repeatable pattern of features 310a, 310b in a grid of system pitches in X and Y. Here, the system pitches in X and Y are equal, thereby forming a grid of squares. From FIG. 3a, one can see that said repeatable pattern does not start at equal grid positions. Feature 310a has a left most feature edge 312a starting at a start point of said system pitch in X-direction, whilst a leftmost feature edge 312b of feature 310b does not start at a start point of said system pitch in X-direction. The features 310a and 310b have a pitch in X-direction, which is not an integer multiple of a system pitch in X-direction. This mismatch in pitches will most probably cause intensity variations in the pattern, i.e., stripes.

In FIG. 3b, a scale of an initial dimension of the pattern in X-direction has been performed in order to match the pattern pitch in X-direction to system pitch in X-direction. As can be seen in FIG. 3b, the leftmost feature edge 312a of feature 310a coincides with the start of a system pitch, which is also true for the left most feature edge 312b of feature 310b. The scale of the pattern is performed in pattern data by for instance applying a constant to features in one direction.

In FIG. 3b, there will most probably not be any intensity variations detected. If the pattern would have been written as it is illustrated in FIG. 3b, the features would appear too small compared to an original and intended design. Therefore, in FIG. 3c the system pitch in X-direction is increased so that features 310a and 310b will be written with correct dimensions.

A square 320 in FIGS. 3a and 3b represents the equal size of system pitch in X-direction and Y-direction. A rectangle 330 in FIG. 3c is a factor f larger in X-direction than said squares in FIG. 3a and FIG. 3b. The factor f is the same factor that the pattern was adjusted or rescaled with in X-direction in order to fit with the system pitch in X-direction in FIG. 3b.

The system pitch may be changed in a direction perpendicular to the scan direction by means of, as mentioned above, changing the wavelength of the interferometer or rescaling the initial interferometer scale by a suitable factor, which interferometer is controlling the position in said direction.

The pattern in FIG. 3c is most probably free of any intensity variations in both X-direction and Y-direction, but suffers from CD-errors due to the fact that the system pitch no longer is an integer multiple of the separation between individual laser beams. In the inventive method, said separation between individual laser beams is adjusted to eliminate or at least reduce said CD-error. For instance, as disclosed above, the focal length and position of the collimator lens system may be used to adjust the separation of the laser beams on the workpiece so that said CD-error is reduced or eliminated.

Assume the system pitch is known to be 0.75 μm, that the multi-beam pitch (for three beams) is 2.25 μm, that the separation between two individual laser beams is 9750 nm, as indicated in FIG. 2, and that the pattern pitch is 100 μm. This size of the pattern pitch is not an even multiple of the multi-beam pitch: 100/2.25=44.44. If a scaling is done in X-direction, so that 44 multi-beam pitches are used and thereafter a rescale back to correct size by adjusting the system pitch, there will be no intensity variations in the pattern. The intermediate pattern pitch is in this case 99 μm, which is an even number of the system pitch. A rescale back from 99 μm to 100 μm in pattern pitch, requires that the system pitch is increased with 100/99=1.010101010. This corresponds to an error in the separation between two laser beams of 1.010101010*9750−9750=98 nm. Most probably, such an error in the separation between two laser beams will result in CD-errors in the pattern.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims. For instance, the support structure may be moving in one direction and the optical system in a perpendicular direction, with the guiding rail at a fixed position as disclosed in U.S. Pat. No. 5,635,976.

The invention claimed is:

1. A method for patterning a workpiece sensitive to electromagnetic radiation by simultaneously using a plurality of exposure beams having a separation in at least a first direction for exposing a pattern with an initial dimension onto said workpiece, where the separation between individual exposure beams is fixed in relation to an initial multi-beam pitch in said first direction, comprising the actions of:
    scaling a pattern in said first direction,
    adjusting the initial multi-beam pitch in said first direction to be an adjusted multi-beam pitch to maintain the dimension of said scaled pattern on said workpiece,
    adjusting said separation between individual exposure beams on said workpiece to said adjusted multi-beam pitch to reduce CD-errors in the pattern on said workpiece.

2. The method according to claim 1, wherein said separation between individual exposure beams on said workpiece is adjusted in said first direction by means of changing a position and a focal length of a collimator lens assembly arranged between a final lens and a modulator.

3. The method according to claim 1, wherein said separation between individual exposure beams on said workpiece is adjusted in said first direction by means of changing a position and a focal length of a modulator lens assembly arranged between a beam splitting device and a modulator.

4. The method according to claim 1, wherein said separation between individual exposure beams on said workpiece is adjusted in said first direction by a beam splitting device arranged between an electromagnetic radiation source and a modulator.

* * * * *